(12) United States Patent
Chen et al.

(10) Patent No.: US 12,302,712 B2
(45) Date of Patent: May 13, 2025

(54) DISPLAY PANEL AND DISPLAY DEVICE

(71) Applicant: BOE Technology Group Co., Ltd., Beijing (CN)

(72) Inventors: Fudong Chen, Beijing (CN); Huajie Yan, Beijing (CN); Qingyu Huang, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 81 days.

(21) Appl. No.: 17/768,830

(22) PCT Filed: Jun. 17, 2021

(86) PCT No.: PCT/CN2021/100548
§ 371 (c)(1),
(2) Date: Apr. 13, 2022

(87) PCT Pub. No.: WO2021/259123
PCT Pub. Date: Dec. 30, 2021

(65) Prior Publication Data
US 2024/0107823 A1 Mar. 28, 2024

(30) Foreign Application Priority Data
Jun. 22, 2020 (CN) .......................... 202010574744.X

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 59/122* (2023.02); *H10K 59/353* (2023.02); *H10K 2102/3026* (2023.02)

(58) Field of Classification Search
CPC ............. H10K 59/124; H10K 59/1201; H10K 59/122; H10K 59/353; H10K 2102/3026;
(Continued)

(56) References Cited

U.S. PATENT DOCUMENTS

2016/0063916 A1\* 3/2016 Ota ...................... G09G 3/3233
345/206
2016/0072069 A1\* 3/2016 Takeuchi ............... H10K 71/00
438/46
(Continued)

FOREIGN PATENT DOCUMENTS

CN 105165122 A 12/2015
CN 106449659 A 2/2017
(Continued)

OTHER PUBLICATIONS

CN 202010574744.X first office action.
PCT/CN2021/100548 international search report and written opinion.

*Primary Examiner* — Robert G Bachner
(74) *Attorney, Agent, or Firm* — IPro, PLLC

(57) ABSTRACT

The present disclosure provides a display panel and a display device. The display panel includes a substrate, a plurality of pixel units is arranged at a side of the substrate, each pixel unit includes a first electrode layer, a first light-emitting layer, a second electrode layer, a second light-emitting layer, a third electrode layer, a third light-emitting layer and a fourth electrode layer laminated one on another, the first light-emitting layer, the second light-emitting layer, and the third light-emitting layer emit light in different colors, and two vertically adjacent light-emitting layers share one electrode layer.

16 Claims, 2 Drawing Sheets

(51) Int. Cl.
*H10K 59/122* (2023.01)
*H10K 59/35* (2023.01)
*H10K 102/00* (2023.01)

(58) Field of Classification Search
CPC ...... H10K 59/131; H10K 59/32; H10K 50/11; H10K 50/131; H10K 2101/10; H10K 50/19
See application file for complete search history.

(56) References Cited

U.S. PATENT DOCUMENTS

| | | | |
|---|---|---|---|
| 2019/0267436 | A1 | 8/2019 | Zhang et al. |
| 2020/0243614 | A1 | 7/2020 | Yang et al. |
| 2021/0327357 | A1 | 10/2021 | Liu et al. |

FOREIGN PATENT DOCUMENTS

| | | | |
|---|---|---|---|
| CN | 208225917 U | 12/2018 | |
| CN | 109564931 A | 4/2019 | |
| CN | 110428778 A | 11/2019 | |
| CN | 111668383 A | 9/2020 | |
| JP | 2006324089 A | 11/2006 | |
| KR | 20100073417 A | 7/2010 | |
| KR | 20160033571 A | 3/2016 | |

\* cited by examiner

DISPLAY PANEL AND DISPLAY DEVICE

CROSS-REFERENCE TO RELATED APPLICATION

This application is the U.S. national phase of PCT Application No. PCT/CN2021/100548 filed on Jun. 17, 2021, which claims a priority of the Chinese patent application No. 202010574744.X filed on Jun. 22, 2020, which is incorporated herein by reference in its entirety.

TECHNICAL FIELD

The present disclosure relates to the design of a display structure, in particular to a display panel and a display device.

BACKGROUND

A conventional Organic Light-Emitting Diode (OLED) display pixel structure mainly includes a red-green-blue (RGB) side-by-side structure and a white light OLED (WOLED)+color film (CF) structure. The RGB side-by-side structure is mainly applied to a small-size portable device, and the WOLED+CF structure is mainly applied to a large-size device such as television (TV).

SUMMARY

In one aspect, the present disclosure provides in some embodiments a display panel, including a substrate. A plurality of pixel units is arranged at a side of the substrate, each pixel unit includes a first electrode layer, a first light-emitting layer, a second electrode layer, a second light-emitting layer, a third electrode layer, a third light-emitting layer and a fourth electrode layer laminated one on another, the first light-emitting layer, the second light-emitting layer and the third light-emitting layer emit light in different colors, the first light-emitting layer and the second light-emitting layer share the second electrode layer, and the second light-emitting layer and the third light-emitting layer share the third electrode layer.

In a possible embodiment of the present disclosure, the first electrode layer is an anode of the first light-emitting layer, the second electrode layer serves as a cathode of the first light-emitting layer and an anode of the second light-emitting layer, and the third electrode layer serves as a cathode of the second light-emitting layer and an anode of the third light-emitting layer.

In a possible embodiment of the present disclosure, an orthogonal projection of the first light-emitting layer onto the substrate, an orthogonal projection of the second light-emitting layer onto the substrate, and an orthogonal projection of the third light-emitting layer onto the substrate completely overlap each other.

In a possible embodiment of the present disclosure, the first light-emitting layer emits green light, the second light-emitting layer emits red light, and the third light-emitting layer emits blue light.

In a possible embodiment of the present disclosure, a pixel definition layer is arranged between the substrate and the first light-emitting layer, and the first electrode layer is arranged in a first aperture of the pixel definition layer.

In a possible embodiment of the present disclosure, a first insulation layer is further arranged between the second electrode layer and the third electrode layer, and the second light-emitting layer is arranged in a second aperture defined by the first insulation layer and on a part of a surface of the first insulation layer.

In a possible embodiment of the present disclosure, an orthogonal projection of the first insulation layer onto the substrate is of a grid shape.

In a possible embodiment of the present disclosure, a second insulation layer is further arranged between the third electrode layer and the fourth electrode layer, and the third light-emitting layer is arranged in a third aperture defined by the second insulation layer and on a part of a surface of the second insulation layer.

In a possible embodiment of the present disclosure, an orthogonal projection of the second insulation layer onto the substrate is of a grid shape.

In a possible embodiment of the present disclosure, a width of the first insulation layer and/or the second insulation layer in a direction parallel to the substrate is 2 μm to 5 μm.

In a possible embodiment of the present disclosure, the second electrode layer includes a portion located in a light-emitting region and a portion located in a first extraction region, the third electrode layer includes a portion located in the light-emitting region and a portion located in a second extraction region, the fourth electrode layer includes a portion located in the light-emitting region and a portion located in a third extraction region, and the portion located in the first extraction region, the portion located in the second extraction region and the portion located in the third extraction region are arranged at different sides of the light-emitting region.

In a possible embodiment of the present disclosure, the second electrode layer, the third electrode layer and the fourth electrode layer are made of a transparent conductive material.

In a possible embodiment of the present disclosure, the display panel further includes a packaging layer arranged on a surface of the plurality of pixel units away from the substrate, and covering the substrate, and the fourth electrode layer and the second insulation layer in each pixel unit.

In another aspect, the present disclosure provides in some embodiments a display device, including the above-mentioned display panel.

In yet another aspect, the present disclosure provides in some embodiments a method for manufacturing a display panel, including: forming a first electrode layer, a first light-emitting layer, a second electrode layer, a second light-emitting layer, a third electrode layer, a third light-emitting layer and a fourth electrode layer sequentially on a substrate. The first light-emitting layer, the second light-emitting layer, and the third light-emitting layer emit light in different colors, the first light-emitting layer and the second light-emitting layer share the second electrode layer, the second electrode layer serves as a cathode of the first light-emitting layer and an anode of the second light-emitting layer, and a cathode of the second light-emitting layer and the third light-emitting layer share the third electrode layer.

In a possible embodiment of the present disclosure, prior to forming the first electrode layer on the substrate, the method further includes forming four extraction lines in each pixel unit on the substrate. The four extraction lines are located at different sides of the pixel unit, a first extraction line is coupled to the first electrode layer, a second extraction line is coupled to the second electrode layer, a third extraction line is coupled to the third electrode layer, and a fourth extraction line is coupled to the fourth electrode layer.

In a possible embodiment of the present disclosure, prior to forming the first light-emitting layer on the substrate, the method further includes forming a pixel definition layer on the substrate, and the first electrode layer is arranged in a first aperture defined by the pixel definition layer.

In a possible embodiment of the present disclosure, subsequent to forming the second electrode layer on the substrate and prior to forming the second light-emitting layer on the substrate, the method further includes forming a first insulation layer on the second electrode layer, and the first insulation layer is configured to define a second aperture for the second light-emitting layer.

In a possible embodiment of the present disclosure, subsequent to forming the third electrode layer on the substrate and prior to forming the third light-emitting layer on the substrate, the method further includes forming a second insulation layer on the third electrode layer, and the second insulation layer is configured to define a third aperture for the third light-emitting layer.

In a possible embodiment of the present disclosure, the method further includes forming a packaging layer at a side of the fourth electrode layer away from the substrate.

In a possible embodiment of the present disclosure, a mask for forming the first light-emitting layer, a mask for forming the second light-emitting layer, and a mask for forming the third light-emitting layer are the same.

The other aspects and advantages of the present disclosure will be given or may become apparent in the following description, or may be understood through the implementation of the present disclosure.

BRIEF DESCRIPTION OF THE DRAWINGS

The drawings desired for the embodiment of the present disclosure will be described hereinafter briefly.

Figure 1:
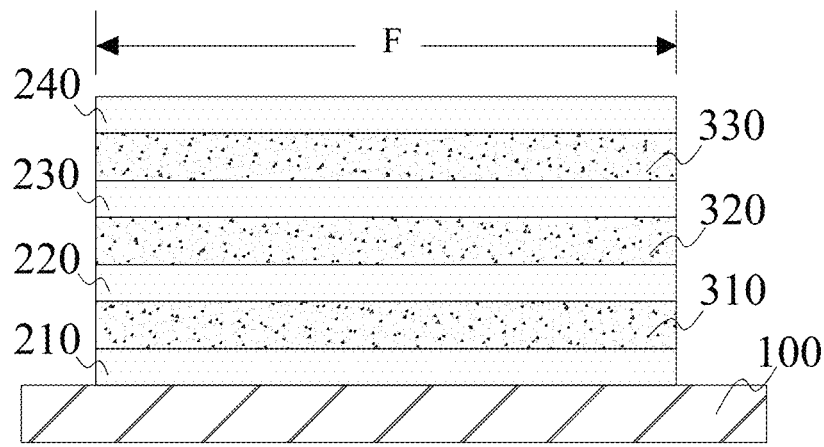
FIG. 1 is a sectional view of a display panel according to one embodiment of the present disclosure.

REFERENCE SIGN LIST 100 substrate
210 first electrode layer
211 first extraction line
310 first light-emitting layer
220 second electrode layer
221 second extraction line
320 second light-emitting layer
230 third electrode layer
231 third extraction line
330 third light-emitting layer
240 fourth electrode layer
241 fourth extraction line
410 pixel definition layer
411 first aperture
420 first insulation layer
421 second aperture
430 third insulation layer
431 third aperture
500 packaging layer

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In two conventional structures, each pixel group includes R/G/B/(W) subpixels arranged in a side-by-side manner, and a required light color is obtained through adjusting a relative intensity of R/G/B. Although it is able to provide a thin and light display device when the subpixels are arranged side by side in a horizontal direction, a resolution of the display device is low. The present disclosure provides in some embodiments a vertical pixel structure design where the sub-pixels emitting light in different colors are vertically laminated one on another in each pixel unit and two vertically adjacent light-emitting layers share one electrode layer. In this regard, it is able to increase Pixels Per Inch (PPI) of the pixel unit by many times. In addition, the shared electrode layer serves as a cathode of a lower light-emitting layer and an anode of an upper light-emitting layer at the same time, so it is able to reduce a thickness of the display panel with the vertical pixel structure design. Furthermore, three light-emitting layers have a completely identical shape, so a same mask is used for forming the three light-emitting layers. An insulation layer is arranged between two adjacent electrodes to prevent the occurrence of short-circuit.

The present disclosure provides in some embodiments a display panel. It should be appreciated that, merely one pixel unit is shown in FIG. 1 to FIG. 4 as an example, and in an actual design, hundreds or thousands of pixel units are arranged on a substrate in an array form.

In the embodiments of the present disclosure, as shown in FIG. 1, the display panel includes a substrate 100. A plurality of pixel units F is arranged at a side of the substrate 100, each pixel unit F includes a first electrode layer 210, a first light-emitting layer 310, a second electrode layer 220, a second light-emitting layer 320, a third electrode layer 230, a third light-emitting layer 330 and a fourth electrode layer 240 laminated one on another, the first light-emitting layer 310, the second light-emitting layer 320 and the third light-emitting layer 330 emit light in different colors, the first light-emitting layer 310 and the second light-emitting layer 320 share the second electrode layer 220, and the second light-emitting layer 320 and the third light-emitting layer 330 share the third electrode layer 230.

In this regard, the sub-pixels in three colors are vertically integrated into one sub-pixel aperture and separately controlled, so as to improve the PPI of the display panel by three times. In addition, two vertically adjacent light-emitting layers share one electrode layer, so it is able to reduce a total thickness of a vertical pixel structure.

According to the embodiments of the present disclosure, the display panel adopts the vertical pixel structure, so as to improve the PPI of the display panel by at least three times. In addition, the two vertically adjacent light-emitting layers share one electrode layer, an intermediate electrode layer serves as a cathode of the lower light-emitting layer and an anode of the upper light-emitting layer at the same time, so it is able to provide a thin and light display panel.

In the embodiments of the present disclosure, the first electrode layer is an anode of the first light-emitting layer, the second electrode layer serves as a cathode of the first light-emitting layer and an anode of the second light-emitting layer, and the third electrode layer serves as a cathode of the second light-emitting layer and an anode of the third light-emitting layer.

In the embodiments of the present disclosure, an orthogonal projection of the first light-emitting layer 310 onto the substrate 100, an orthogonal projection of the second light-emitting layer 320 onto the substrate 100, and an orthogonal projection of the third light-emitting layer 330 onto the substrate 100 completely overlap each other.

In this regard, a same mask is used for forming the three light-emitting layers, i.e., an overlapping region of the three light-emitting layers is a light-emitting region A, so as to effectively reduce the manufacture cost of the display panel, thereby to improve the alignment accuracy in the manufacturing process.

In the embodiments of the present disclosure, the first light-emitting layer 310 emits green light (G), the second light-emitting layer 320 emits red light (R), and the third light-emitting layer 330 emits blue light (B).

In this regard, for a top-emission OLED display panel, the green light emitted by the first light-emitting layer 310 at the bottom is the brightest, and the blue light emitted by the third light-emitting layer 330 at the top is the weakest. By adopting a vertical structure of GRB from bottom to top, it is able to achieve white balance of the display panel in a better manner and reduce the power consumption. It should be appreciated that, the present disclosure is not limited thereto, e.g., the first light-emitting layer 310 emits blue light (B), the second light-emitting layer 320 emits red light (R), and the third light-emitting layer 330 emits green light (G).

Figure 2:
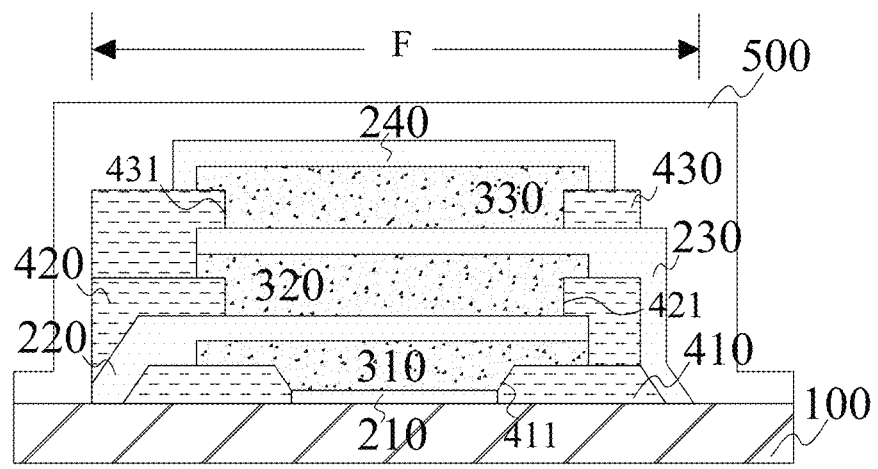
FIG. 2 is another sectional view of the display panel according to one embodiment of the present disclosure.

In the embodiments of the present disclosure, as shown in FIG. 2, a pixel definition layer 410 is arranged between the substrate 100 and the first light-emitting layer 310, and the first electrode layer 210 is arranged in a first aperture 411 of the pixel definition layer 410.

In this regard, the pixel definition layer 410 may not merely define a region for the first electrode layer 210, but also insulate the first electrode layer 210 as the anode of the first light-emitting layer 310 from the second electrode layer 220 as the cathode of the first light-emitting layer 310, thereby to prevent the occurrence of short-circuit due to an alignment offset in the manufacturing process.

In the embodiments of the present disclosure, as shown in FIG. 2, a first insulation layer 420 is further arranged between the second electrode layer 220 and the third electrode layer 230, and the second light-emitting layer 320 is arranged in a second aperture 421 defined by the first insulation layer 420 and on a part of a surface of the first insulation layer 420. At the same time, a second insulation layer 430 is further arranged between the third electrode layer 230 and the fourth electrode layer 240, and the third light-emitting layer 330 is arranged in a third aperture 431 defined by the second insulation layer 430 and on a part of a surface of the second insulation layer 430.

In this regard, similar to a function of the pixel definition layer 410, the first insulation layer 420 may isolate the second electrode layer 220 as the anode of the second light-emitting layer 320 from the third electrode layer 230 as the cathode of the second light-emitting layer 320, and the second insulation layer 430 may isolate the third electrode layer 230 as the anode of the third light-emitting layer 330 from the fourth electrode layer 240 as the cathode of the third light-emitting layer 330, so as to improve the circuitry safety of the vertical pixel structure.

In the embodiments of the present disclosure, as shown in FIG. 4(e), a width of the first insulation layer 420 surrounding the light-emitting region in a direction parallel to the substrate is 2 μm to 5 μm, and as shown in FIG. 4(h), a width of the second insulation layer 430 surrounding the light-emitting region is 2 μm to 5 μm.

In this regard, as long as the width of the insulation layer is greater than the alignment accuracy (generally 1.5 μm) for forming the light-emitting layer, it is able to prevent the occurrence of short-circuit for the cathodes of the upper and lower light-emitting layers due to the alignment offset.

In the embodiments of the present disclosure, an orthogonal projection of the first insulation layer 420 onto the substrate and an orthogonal projection of the second insulation layer 430 onto the substrate 100 are of a grid shape.

In the embodiments of the present disclosure, the second electrode layer 220 includes a portion located in a light-emitting region A and a portion located in a first extraction region C1, the third electrode layer 230 includes a portion located in the light-emitting region A and a portion located in a second extraction region C2, the fourth electrode layer 240 includes a portion located in the light-emitting region A and a portion located in a third extraction region C3, and the portion located in the first extraction region C1, the portion located in the second extraction region C2 and the portion located in the third extraction region C3 are arranged at different sides of the light-emitting region A.

Figure 3:
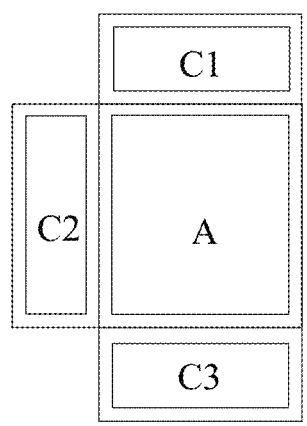
FIG. 3 is a top view of a relationship of three electrode layers according to one embodiment of the present disclosure.
Figure 4:
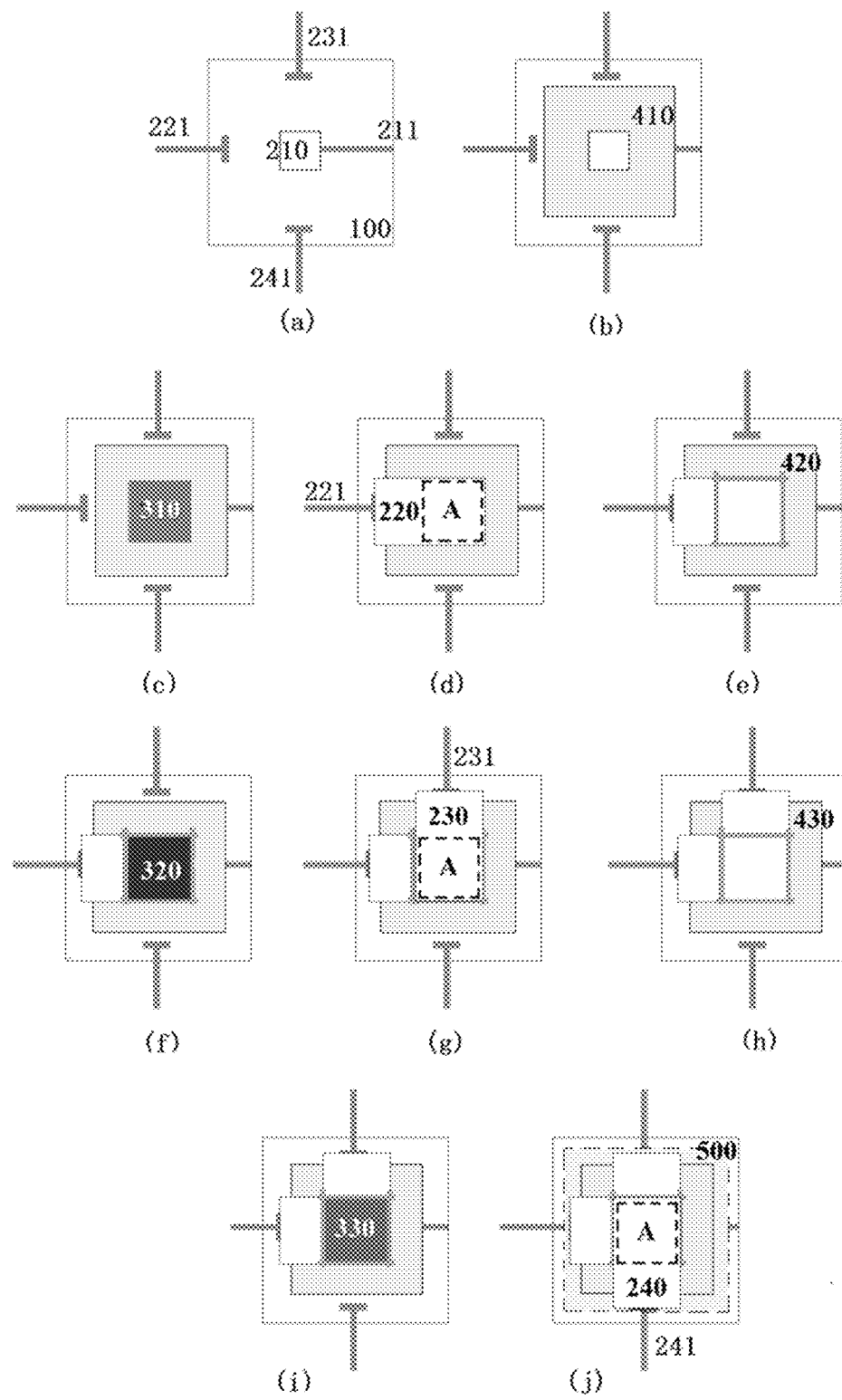
FIG. 4 is a schematic view showing a method for manufacturing the display panel according to one embodiment of the present disclosure.

To be specific, as shown in FIG. 3, the first extraction region C1 is arranged above the light-emitting region A, the second extraction region C2 is arranged on a left side of the light-emitting region A, the third extraction region C3 is arranged below the light-emitting region A, and a right side of the light-emitting region A is reserved for the extraction of the first electrode layer. With the design, it is able to fully utilize the space surrounding each light-emitting layer, so as to extract the four electrode layers in different directions, thereby to provide the pixel unit with a more appropriate circuitry design.

In the embodiments of the present disclosure, the second electrode layer 220, the third electrode layer 230, and the fourth electrode layer 240 are made of a transparent conductive material, e.g., a dielectric/metal/dielectric (DMD) laminated structure. In this regard, the light is allowed to pass through the three electrode layers, and meanwhile each of the two intermediate electrode layers serves as the cathode of the lower light-emitting layer and the anode of the upper light-emitting layer. In the embodiments of the present disclosure, the first electrode layer 210 is made of indium tin oxide (ITO), so as to improve the light-emitting efficiency of the first light-emitting layer.

In the embodiments of the present disclosure, as shown in FIG. 2, a packaging layer 500 is arranged on a surface of the plurality of pixel units away from the substrate 100, and covers the substrate 100, and the fourth electrode layer 240 and the second insulation layer 430 in each pixel unit.

In this regard, the plurality of pixel units F with the vertical structure design on the substrate 100 may be packaged by the packaging layer 500, so as to prevent oxygen and moisture from entering the display panel, thereby to prolong a service life of the display panel.

During the manufacture, as shown in FIG. 4(a) to FIG. 4(j), four extraction lines are formed in each pixel unit on the substrate 100 in advance. Next, the first electrode layer 210 is formed in such a manner as to be lapped onto the first extraction line 211 on the right. Next, the pixel definition layer 410 is formed, and the first light-emitting layer 310 is formed in such a manner as to be in direct contact with the first electrode layer 210 through the first aperture in the pixel definition layer. Next, the second electrode layer 220 is formed in such a manner as to completely cover the light-emitting region A and be lapped onto the second extraction line 221 on the left. Next, the first insulation layer 420 is formed in such a manner as to surround the light-emitting region or be of a grid shape. Next, the second light-emitting layer 320 is formed through a same mask for the first light-emitting layer 310 in such a manner as to be in direct contact with the second electrode layer 220 through the second aperture in the first insulation layer. Next, the third electrode layer 230 is formed in such a manner as to completely cover the light-emitting region A and be lapped onto the third extraction line 231. Next, the second insulation layer 430 is formed in such a manner as to surround the light-emitting region A. Next, the third light-emitting layer 330 is formed through the same mask for forming the first light-emitting layer 310 in such a manner as to be in direct contact with the third electrode layer 230 through the third aperture in the second insulation layer. Next, the fourth electrode layer 240 is formed in such a manner as to completely cover the light-emitting region A and be lapped onto the fourth extraction line 241. Then, a packaging layer 500 (at a region surrounded by a dotted line in FIG. 4) is formed at a side of the plurality of pixel units away from the substrate 100.

In summary, according to the embodiments of the present disclosure, the display panel adopts the vertical pixel structure, so as to improve the PPI of the display panel by at least three times. In addition, the two vertically adjacent light-emitting layers share one electrode layer, and an intermediate electrode layer serves as a cathode of the lower light-emitting layer and an anode of the upper light-emitting layer at the same time, so it is able to provide a thin and light display panel.

The present disclosure further provides in some embodiments a display device including the above-mentioned display panel.

According to the display device in the embodiments of the present disclosure, the PPI of the display panel is large and the thickness of the display panel is small, so it is able to provide a thin and light display device while achieving a higher definition. It should be appreciated that, the features and advantages of the display panel may also be applied to the display device, and thus will not be particularly defined herein.

In the embodiments of the present disclosure, a specific type of the display device will not be particularly defined, such as a display screen, a television, a mobile phone, a tablet computer or a smart watch, and a person skilled in the art may select the display device according to the practical need. It should be appreciated that, in addition to the display panel, the display device further includes other necessary components and structures. Taking an OLED display screen as an example, it may further include a touch panel, a housing, a control circuit board or a power source line. The components of the display device may be selected in accordance with its functions, and thus will not be particularly defined herein.

In summary, in the embodiments of the present disclosure, the PPI of the display panel is large and the thickness of the display panel is small, so it is able to provide a thin and light display device while achieving a higher definition. It should be appreciated that, the features and advantages of the display panel may also be applied to the display device, and thus will not be particularly defined herein.

It should be appreciated that, such words as "in the middle of", "longitudinal", "lateral", "length", "width", "thickness", "on/above", "under/below", "front", "back", "left", "right", "vertical", "horizontal", "top", "bottom", "inside", "outside", "clockwise", "anticlockwise", "axial", "radial" and "circumferential" may be used to indicate directions or positions as viewed in the drawings, and they are merely used to facilitate the description in the present disclosure, rather than to indicate or imply that a device or member must be arranged or operated at a specific position.

In addition, such words as "first", "second" and "third" are merely used to differentiate different components rather than to represent any order, number or importance, i.e., they are used to implicitly or explicitly indicate that there is at least one component. Further, such a phrase as "a plurality of" is used to indicate that there are at least two, e.g., two or three, components, unless otherwise specified.

Such expressions as "one embodiment", "embodiments", "examples" and "for example" intend to indicate that the features, structures or materials are contained in at least one embodiment or example of the present disclosure, rather than referring to an identical embodiment or example. In addition, the features, structures or materials may be combined in any embodiment or embodiments in an appropriate manner. In the case of no conflict, the embodiments or examples or the features therein may be combined in any form.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display panel, comprising a substrate, wherein a plurality of pixel units is arranged at a side of the substrate, each pixel unit comprises a first electrode layer, a first light-emitting layer, a second electrode layer, a second light-emitting layer, a third electrode layer, a third light-emitting layer and a fourth electrode layer laminated one on another, the first light-emitting layer, the second light-emitting layer, and the third light-emitting layer emit light in different colors, the first light-emitting layer and the second light-emitting layer share the second electrode layer, and the second light-emitting layer and the third light-emitting layer share the third electrode layer;

wherein a first insulation layer is further arranged between the second electrode layer and the third electrode layer, and the second light-emitting layer is arranged in a second aperture defined by the first insulation layer and on a part of a surface of the first insulation layer;

wherein a second insulation layer is further arranged between the third electrode layer and the fourth electrode layer, and the third light-emitting layer is arranged in a third aperture defined by the second insulation layer and on a part of a surface of the second insulation layer.

2. The display panel according to claim 1, wherein the first electrode layer is an anode of the first light-emitting layer, the second electrode layer serves as a cathode of the first light-emitting layer and an anode of the second light-emitting layer, and the third electrode layer serves as a cathode of the second light-emitting layer and an anode of the third light-emitting layer.

3. The display panel according to claim 1, wherein an orthogonal projection of the first light-emitting layer onto the substrate, an orthogonal projection of the second light-emitting layer onto the substrate, and an orthogonal projection of the third light-emitting layer onto the substrate completely overlap each other.

4. The display panel according to claim 1, wherein the first light-emitting layer emits green light, the second light-emitting layer emits red light, and the third light-emitting layer emits blue light.

5. The display panel according to claim 1, wherein a pixel definition layer is arranged between the substrate and the first light-emitting layer, and the first electrode layer is arranged in a first aperture of the pixel definition layer.

6. The display panel according to claim 1, wherein an orthogonal projection of the first insulation layer onto the substrate is of a grid shape.

7. The display panel according to claim 1, wherein an orthogonal projection of the second insulation layer onto the substrate is of a grid shape.

8. The display panel according to claim 1, wherein a width of the first insulation layer and/or the second insulation layer in a direction parallel to the substrate is 2 μm to 5 μm.

9. The display panel according to claim 3, wherein the second electrode layer comprises a portion located in a light-emitting region and a portion located in a first extraction region, the third electrode layer comprises a portion located in the light-emitting region and a portion located in a second extraction region, the fourth electrode layer comprises a portion located in the light-emitting region and a portion located in a third extraction region, and the portion located in the first extraction region, the portion located in the second extraction region and the portion located in the third extraction region are arranged at different sides of the light-emitting region.

10. The display panel according to claim 1, wherein the second electrode layer, the third electrode layer, and the fourth electrode layer are made of a transparent conductive material.

11. The display panel according to claim 1, further comprising a packaging layer arranged on a surface of the plurality of pixel units away from the substrate, and covering the substrate, and the fourth electrode layer and the second insulation layer in each pixel unit.

12. A display device, comprising the display panel according to claim 1.

13. A method for manufacturing a display panel, comprising forming a first electrode layer, a first light-emitting layer, a second electrode layer, a second light-emitting layer, a third electrode layer, a third light-emitting layer and a fourth electrode layer sequentially on a substrate, wherein the first light-emitting layer, the second light-emitting layer, and the third light-emitting layer emit light in different colors, the first light-emitting layer and the second light-emitting layer share the second electrode layer, the second electrode layer serves as a cathode of the first light-emitting layer and an anode of the second light-emitting layer, and the second light-emitting layer and the third light-emitting layer share the third electrode layer;

wherein subsequent to forming the second electrode layer on the substrate and prior to forming the second light-emitting layer on the substrate, the method further comprises forming a first insulation layer on the second electrode layer, wherein the first insulation layer is configured to define a second aperture for the second light-emitting layer;

wherein subsequent to forming the third electrode layer on the substrate and prior to forming the third light-emitting layer on the substrate, the method further comprises forming a second insulation layer on the third electrode layer, wherein the second insulation layer is configured to define a third aperture for the third light-emitting layer.

14. The method according to claim 13, wherein prior to forming the first electrode layer on the substrate, the method further comprises forming four extraction lines in each pixel unit on the substrate, wherein the four extraction lines are located at different sides of the pixel unit, a first extraction line is coupled to the first electrode layer, a second extraction line is coupled to the second electrode layer, a third extraction line is coupled to the third electrode layer, and a fourth extraction line is coupled to the fourth electrode layer, wherein prior to forming the first light-emitting layer on the substrate, the method further comprises forming a pixel definition layer on the substrate, wherein the first electrode layer is arranged in a first aperture defined by the pixel definition layer.

15. The method according to claim 13, further comprising forming a packaging layer at a side of the fourth electrode layer away from the substrate.

16. The method according to claim 13, wherein a mask for forming the first light-emitting layer, a mask for forming the second light-emitting layer and a mask for forming the third light-emitting layer are the same.

\* \* \* \* \*